United States Patent
Weilemann, II et al.

(10) Patent No.: US 9,329,932 B2
(45) Date of Patent: May 3, 2016

(54) IMMINENT READ FAILURE DETECTION BASED UPON UNACCEPTABLE WEAR FOR NVM CELLS

(71) Applicants: Jon W. Weilemann, II, Austin, TX (US); Richard K. Eguchi, Austin, TX (US)

(72) Inventors: Jon W. Weilemann, II, Austin, TX (US); Richard K. Eguchi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 88 days.

(21) Appl. No.: 14/262,116

(22) Filed: Apr. 25, 2014

(65) Prior Publication Data

US 2015/0309857 A1    Oct. 29, 2015

(51) Int. Cl.
| | |
|---|---|
| G11C 29/00 | (2006.01) |
| G06F 11/10 | (2006.01) |
| G06F 11/07 | (2006.01) |
| G06F 11/00 | (2006.01) |
| G11C 16/34 | (2006.01) |
| G11C 11/56 | (2006.01) |

(52) U.S. Cl.
CPC .......... *G06F 11/1008* (2013.01); *G06F 11/008* (2013.01); *G06F 11/073* (2013.01); *G06F 11/0757* (2013.01); *G06F 11/1068* (2013.01); *G11C 16/349* (2013.01); *G11C 11/5642* (2013.01)

(58) Field of Classification Search
CPC    G06F 11/0772; G06F 11/078; G06F 11/1008
See application file for complete search history.

(56) References Cited

U.S. PATENT DOCUMENTS

| | | | |
|---|---|---|---|
| 6,226,200 B1 | 5/2001 | Eguchi et al. | |
| 6,684,353 B1 | 1/2004 | Parker et al. | |
| 7,865,797 B2 | 1/2011 | Eguchi et al. | |
| 7,944,744 B2 | 5/2011 | Bryant-Rich | |
| 8,095,836 B2 | 1/2012 | Eguchi et al. | |
| 8,321,727 B2 | 11/2012 | D'Abreu et al. | |
| 8,504,884 B2 | 8/2013 | Eguchi et al. | |
| 2009/0204852 A1* | 8/2009 | Diggs ................. | G06F 11/008 714/42 |
| 2011/0107160 A1 | 5/2011 | Eguchi et al. | |

(Continued)

OTHER PUBLICATIONS

Weilemann et al., "Imminent Read Failure Detection Using High/Low Read Voltage Levels", U.S. Appl. No. 14/262,074, filed Apr. 25, 2014; 28 pgs.

(Continued)

*Primary Examiner* — Sam Rizk
(74) *Attorney, Agent, or Firm* — Egan, Peterman, Enders & Huston LLP

(57) ABSTRACT

Methods and systems are disclosed for imminent read failure detection based upon unacceptable wear for non-volatile memory (NVM) cells. In certain embodiments, a first failure time is recorded when a first diagnostic mode detects an uncorrectable error within the NVM cell array using a first set of read voltage levels below and above a normal read voltage level. A second failure time is recorded when a second diagnostic mode detects an uncorrectable error within the NVM cell array using a second set of read voltage levels below and above a normal read voltage level. The first and second failure times are then compared against a threshold wear time value to determine whether or not an imminent read failure is indicated. The diagnostic modes can be run separately for erased NVM cell distributions and programmed NVM cell distributions to provide separate wear rate determinations.

20 Claims, 4 Drawing Sheets

(56) References Cited

U.S. PATENT DOCUMENTS

2012/0254699 A1 10/2012 Ruby et al.
2014/0059398 A1* 2/2014 Cunningham ...... G06F 11/1048
　　　　　　　　　　　　　　　　　　　　　　　714/721

OTHER PUBLICATIONS

Weilemann et al., "Imminent Read Failure Detection Based Upon Changes in Error Voltage Windows for NVM Cells", U.S. Appl. No. 14/262,157, filed Apr. 25, 2014; 25 pgs.

Office Action mailed Sep. 18, 2015, for Weilemann et al., "Imminent Read Failure Detection Using High/Low Read Voltage Levels", U.S. Appl. No. 14/262,074, filed Apr. 25, 2014; 14 pgs.

Office Action mailed Sep. 24, 2015, for Weilemann et al., "Imminent Read Failure Detection Based Upon Changes in Error Voltage Windows for NVM Cells", U.S. Appl. No. 14/262,157, filed Apr. 25, 2014, 12 pgs.

Response to Action filed Dec. 21, 2015, for Weilemann et al., "Imminent Read Failure Detection Using High/Low Read Voltage Levels", U.S. Appl. No. 14/262,074, filed Apr. 25, 2014; 8 pgs.

Office Action mailed Sep. 24, 2015, for Weilemann et al., "Imminent Read Failure Detection Based Upon Changes in Error Voltage Windows for NVM Cells", U.S. Appl. No. 14/262,157, filed Apr. 25, 2014, 8 pgs.

* cited by examiner

US 9,329,932 B2

IMMINENT READ FAILURE DETECTION BASED UPON UNACCEPTABLE WEAR FOR NVM CELLS

RELATED APPLICATIONS

This application is related in subject matter to the following concurrently filed applications: U.S. patent application Ser. No. 14/262,074, entitled "IMMINENT READ FAILURE DETECTION USING HIGH/LOW READ VOLTAGE LEVELS," and U.S. patent application Ser. No. 14/262,157, entitled "IMMINENT READ FAILURE DETECTION BASED UPON CHANGES IN ERROR VOLTAGE WINDOWS FOR NVM CELLS," and which are each hereby incorporated by reference in its entirety.

TECHNICAL FIELD

This technical field relates to non-volatile memories (NVMs) and, more particularly, to techniques for detecting imminent read failures for data stored by NVM cells.

BACKGROUND

Programmable memories have been implemented using non-volatile memory (NVM) cells with each cell storing a bit of data. These programmable memories can be implemented as stand-alone memory integrated circuits or can be embedded within other integrated circuits.

During operation, data stored within NVM cells can include errors. As such, many NVM systems use error correction code (ECC) routines to improve performance. For example, for multi-bit data located at a given address within the NVM system, an ECC routine is applied to the multi-bit data to generate ECC data that is stored within the NVM system and associated with the multi-bit data. When this multi-bit data is subsequently read from the address location, the ECC routine is performed again to re-generate the ECC data for the multi-bit data. The re-generated ECC data is then compared to the original ECC data to determine if there are bit errors associated with the data stored at that address. For example, ECC routines can be employed that can identify and correct single-bit errors and that can identify but not correct double-bit errors. Further, for such ECC routines, errors including three or more bits can be inaccurately detected as single-bit or double-bit errors or no errors.

For some applications where read failures can cause catastrophic results, it is desirable to detect uncorrectable read failures that have not yet occurred but are likely to occur in the near future. Identifying imminent read failures for NVM cells allow these read failures to be avoided thereby avoiding potential catastrophic results for sensitive applications.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for imminent read failure detection based upon unacceptable wear for non-volatile memory (NVM) cells. In certain embodiments, data stored within an array of NVM cells is checked using a first diagnostic mode and read voltage levels below and above a normal read voltage level until a first uncorrectable error is detected. A first failure time is recorded for this event. The data stored within the array of NVM cells is then checked using a second diagnostic mode and different read voltage levels below and above a normal read voltage level until a second uncorrectable error is detected. A second failure time is recorded for this event. The first and second failure times are then compared against a threshold wear time value to determine if the rate of wear for the array of NVM cells is unacceptable. If so, an imminent read failure is indicated. The two diagnostic modes are also run separately for erased NVM cell distributions and programmed NVM cell distributions to provide separate wear rate determinations. For the array data checks, an address sequencer can be used to cycle through addresses within the array of NVM cells; error correction code (ECC) logic can be used to detect read errors; and a bias generator can be used to adjust the read voltage levels for the array of NVM cells. Different features and variations can also be implemented and related or modified systems and method can be utilized, as well.

As described further herein, wear within the NVM cell array will cause the read voltage levels for the NVM cells to shift towards the normal read voltage level. Diagnostic modes are used to determine times when these read voltage levels cross two different sets of margin read levels as identified by the existence of uncorrectable errors, such as bit errors that are uncorrectable by one or more error correction code (ECC) routines used within the NVM system. The time difference between these two events can then be compared to a threshold value. The threshold value can be stored within the NVM system such as within a predefined calibration table. If the detected time difference is less than the threshold value, the NVM cell array is deemed to be wearing too fast, and this unacceptable wear is deemed to represent an imminent read failure condition where false read pass determinations may occur. An imminent failure indicator can be output by the NVM system and/or a flag can be set within the NVM system to indicate the imminent failure condition. Further, separate wear rate determinations are made for erased cell distributions and programmed cell distributions within the NVM system.

Figure 1:
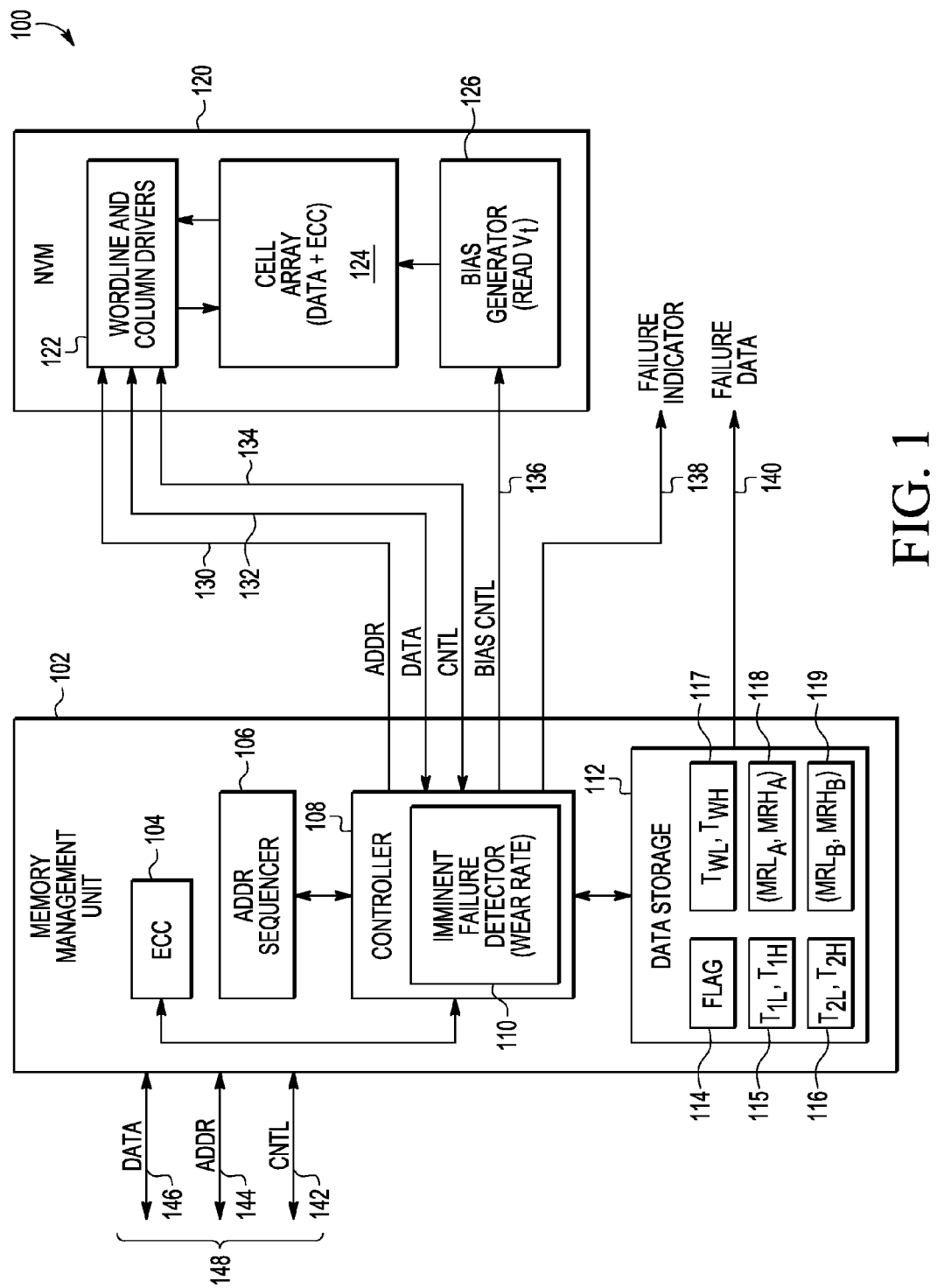
FIG. 1 is a block diagram for an NVM system that includes a memory management unit that detects wear rates for non-volatile memory (NVM) cells within an NVM.

FIG. 1 is a block diagram for an NVM system 100 that includes a memory management unit (MMU) 102 and a non-volatile memory (NVM) 120. The NVM 120 includes an array of NVM cells 124, wordline and column drivers 122, and bias generator 126. The memory management unit 102 includes error correction code (ECC) logic 104, address sequencer 106, controller 108, and data storage medium 112. The memory management unit 102 and the NVM 120 in part communicate address information through address (ADDR) signal lines 130, data through data (DATA) signal lines 132, and control information through control (CNTL) signal lines 134. The controller 108 further includes an imminent failure detector 110 that runs diagnostic modes to determine imminent failures based upon wear rates associated with diagnostic reads, as described in more detail below. Read margin levels (e.g., read threshold voltage (Vt) levels) are adjusted for the cell array 124 through bias control (CNTL) signals 136 provided to the bias generator 126. For a read operation, an NVM cell will be deemed to be programmed (e.g., representing a first logic level) if it has a voltage level above the read voltage level, and an NVM cell will be deemed to be erased (e.g., representing a complement logic level) if it has a voltage level below the read voltage level.

Results and other data for the imminent failure determination can be stored as data within data storage medium 112. Failure related data can include, for example, a pass/fail flag 114, first time of failure values ($T_{1L}$, $T_{1H}$) 115 associated with detection of uncorrectable errors by a first diagnostic mode, second time of failure values ($T_{2L}$, $T_{2H}$) 116 associated with detection of uncorrectable errors by a second diagnostic mode, predetermined wear time threshold values ($T_{WL}$, $T_{WH}$) 117, low/high adjusted read voltage levels ($MRL_A$, $MRH_A$) 118 for the first diagnostic mode, low/high adjusted read voltage levels ($MRL_B$, $MRH_B$) 119 for the second diagnostic mode, and/or other data. A failure indicator 138 can be output by the memory management unit 102, and failure data 140 can be accessed by external circuitry or devices coupled to the memory management unit 102 and/or output by the NVM system 100 for use by external circuitry or devices. It is noted that the memory management unit 102 can be configured to communicate with external devices or circuitry through signal lines 148. For example, control information can be communicated through control (CNTL) signal lines 142; address information can be communicated through address (ADDR) signal lines 144; and data information can be communicated through data (DATA) signal lines 146. Additional and/or different interfaces can also be provided for the NVM system 100.

It is further noted that the memory control circuitry 102 and the NVM 120 can be integrated within a single integrated circuit or can be within separate integrated circuits, as desired. External devices or circuitry that communicate through signal lines 148 with the NVM system 100 can be additional circuitry that is located within the same integrated circuit(s) as the NVM system 100 or can be external to the integrated circuit(s) that include the NVM system 100. It is also noted that the NVM system 100 can include components and/or functional blocks in addition to the memory management unit 102 and the NVM 120, and the memory management unit 102 and/or the NVM 120 can also include additional functional blocks in addition to those depicted.

The NVM cell array 124 includes a plurality of NVM cells. In operation, the NVM cells are placed in programmed or erased states that represent logic values stored by the NVM cells. Error correction code (ECC) data associated with ECC routines implemented by the ECC logic 104 can be stored along with the data within the NVM cell array 124 or can be stored in another data storage medium such as data storage medium 112. For writes, the ECC logic 104 receives data to be stored in the NVM cell array 124 and generates the ECC data using one or more ECC routines. When the data is subsequently read from the NVM array 124 during a normal read operation or during a diagnostic read operation, the ECC data is also read. The ECC logic 104 then re-generates ECC check data based upon the data read from the NVM cell array 124. The ECC check data is then compared against the stored ECC data. If this comparison matches, then the data is deemed correct. If the comparison does not match, the data is deemed to include errors. In certain embodiments, the ECC routine(s) within the ECC logic 104 are configured to detect and correct single-bit errors and to detect but not correct double-bit errors. Other ECC routines could also be used that detect uncorrectable errors.

The wordline driver and column drivers 122 provide access to the cell array 124. Wordline drivers apply wordline voltages to select rows of NVM cells within the NVM cell array 124. The rows of NVM cells are selected based upon the row address (ADDR) information 130 provided by the memory management unit 102. The column drivers access bit lines associated with the selected rows of NVM cells. Data to be written to and read from the cell array 124 is provided from the wordline and column drivers 122 to the memory management unit through data signals 132. The bias generator 126 generates bias signals that are applied to the cell array 124 during memory operations such as program, soft program, program verify, soft program verify, erase, erase verify, and/or read operations. The read voltage (Vt) level, which is adjusted in the embodiment described herein, is determined by the bias signals provided by the bias generator 126 to the NVM cell array 124. The data storage medium 112 can be any volatile or non-volatile programmable data storage medium that is configured to store data, such as a data register, a DRAM (dynamic random access memory), an additional NVM, and/or other data storage medium. The data storage medium 112 could also be located internal to or external from the memory management unit 102. For example, a portion of the NVM 120 could be used to provide the data storage medium 112. Other variations could also be implemented.

Read operations are used for memory diagnostics in addition to normal non-diagnostic read operations. For memory diagnostics, the controller 108 uses the address sequencer 106 to access each of the addresses within the cell array 124, reads data associated from each these addresses, and applies the ECC routine(s) to the read data to determine if data errors exist within the cell array. As described in more detail herein, the imminent error detector 110 uses two diagnostic modes to detect imminent read failures based upon separate wear rates for erased and programmed NVM cells within the NVM cell array 124. The failure indicator 138 indicates whether an imminent failure is detected, and the failure data 140 includes data associated with the imminent failure and/or other desired information related to the imminent failure.

As described above, the ECC logic 104 applies one or more ECC routines to data being written to the NVM cell array 104 and generates ECC data that is stored and associated with data written to the NVM cell array 104. During a read operation, the ECC data is compared to re-generated ECC data to determine if data read from the NVM cell array includes bit errors. As further described below, the results of the ECC routine(s) applied by the ECC logic 104 are used by the imminent failure detector 110. It is further noted that the embodiments disclosed herein can use any desired ECC routine where single-bit or multiple-bit errors are detected and where certain detected errors are not correctable by the ECC routine(s). For example, ECC routine(s) can be used that are able to detect and correct single-bit errors and are able to detect but not correct double-bit errors. It is further noted that the one or more ECC routines used for ECC logic 104 can be based upon Hamming codes, Reed-Solomon codes, BCH (Bose-Chaudhuri-Hocquenghem) codes, Viterbi decoders, and/or other error correction code techniques, as desired.

It is noted that the NVM systems described herein can be a variety of different NVM systems, including FLASH memory systems, systems using floating-gate NVM cells, systems using split-gate NVM cells, and/or other desired NVM systems. Further, charge storage layers within NVM cells can include discrete charge storage layers (e.g., silicon nanocrystals, metal nanoclusters, nitride, etc.), continuous charge storage layers (e.g., polysilicon, etc.), or other charge storage layers, if desired.

Figure 2:
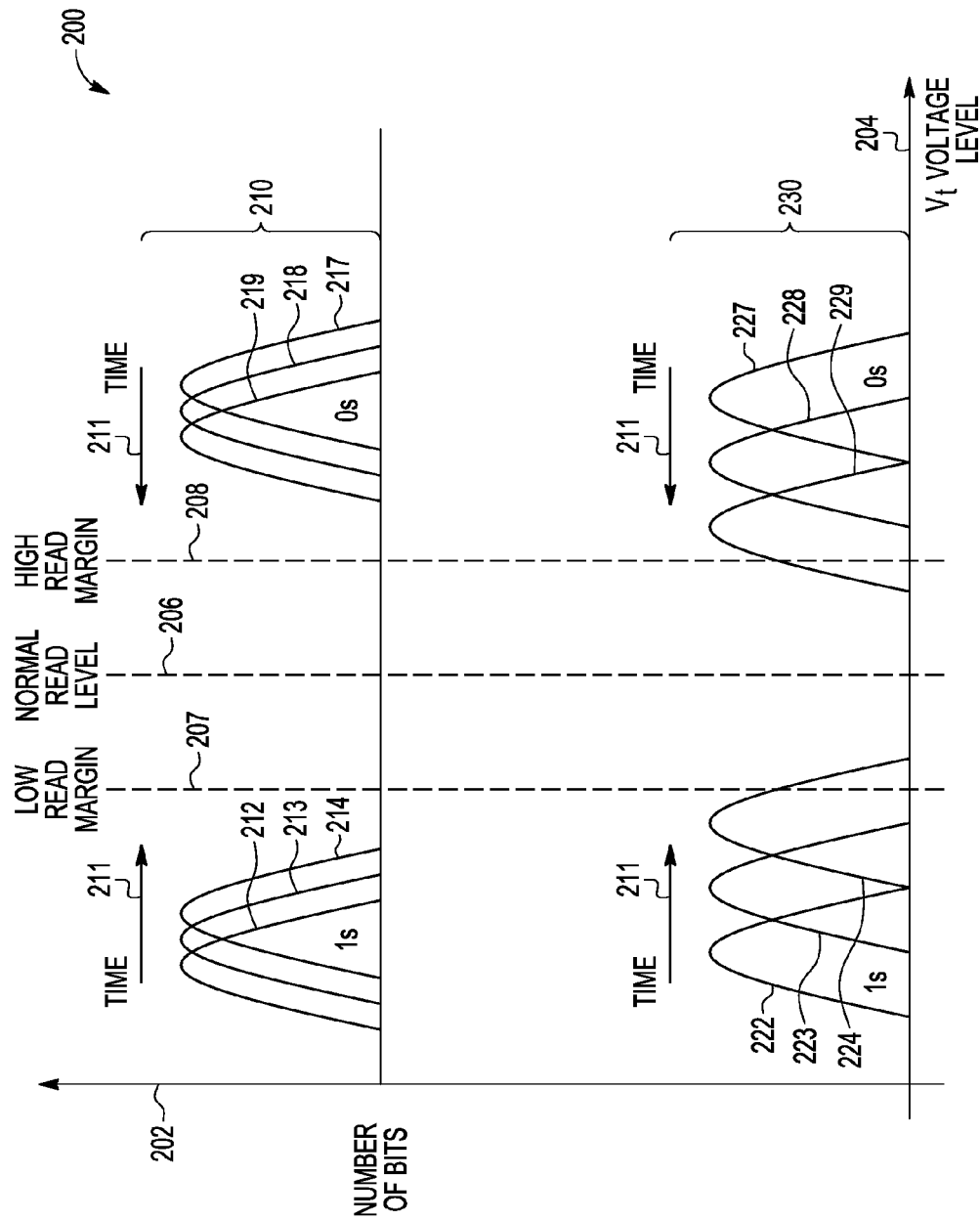
FIG. 2 is a bit distribution histogram showing representative changes that can occur in voltages stored in erased and programmed NVM cells over time.

FIG. 2 is a bit distribution histogram 200 showing representative changes that can occur in voltages stored in NVM cells over time. The y-axis 202 represents a number of bits within the array having threshold voltage (Vt) levels in an erased state (e.g., representing logic 1s) and in a programmed state (e.g., representing logic 0s). The x-axis 204 represents threshold voltage (Vt) levels for the NVM cells. The distribution curves 212, 213, 214, 222, 223, and 224 represent the erased state bits, and the distribution curves 217, 218, 219, 227, 228, and 229 represent the programmed state bits. Voltage level 206 represents a normal read level such that bits having voltage levels above this read level are deemed to be programmed bits (e.g., logic 0s) and bits having voltage levels below this read level are deemed to be erased bits (e.g., logic 1s). Voltage level 207 represents a low read margin voltage level that is at a voltage lower than the normal read voltage level 206. Voltage 208 represents a high read margin voltage level that is at a voltage higher than the normal read voltage level 206. It is also noted that the logic 0 or logic 1 designation give to an erased or programmed bit could be switched, if desired, such that an erased bit is a logic 0 and a programmed bit is a logic 1. It is also noted that the erased bits represent NVM cells that are in an erased state and that programmed bits represent NVM cells in a programmed state.

As one example, the normal read voltage level 206 can be 4.5 volts; an example low read margin voltage level 207 can be 4.2 volts; and an example high read margin voltage level 208 can be 4.8 volts. It is noted that the low read margin level 207 can be above an erase verify voltage level for the erased distribution curves, which can be for example 3.4 volts. The high read margin level 208 can be below a program verify voltage level for the programmed distribution curves, which can be for example 6.0 volts. Other variations could also be implemented.

Distributions 210 provides changes that can occur in the voltage distributions over time due to wear for the NVM cells where the wear is occurring at an acceptable rate. For example, the initial voltage distribution 212 for erased cells moves higher over time as represented by arrow 211 and distributions 213 and 214. As further described herein, the wear rate for the NVM cells is deemed acceptable because the voltage distributions for the erased cells remain below the low read margin voltage level 207 over a selected time period represented by arrow 211. Similarly, the initial voltage distribution 217 for programmed cells moves lower over time as represented by arrow 211 and distributions 218 and 219. As further described herein, the wear rate for the NVM cells is deemed acceptable because the voltage distributions for the programmed cells remain above the high read margin voltage level 208 over a selected time period represented by arrow 211.

Distributions 230 provides changes that can occur in the voltage distributions over time due to wear for the NVM cells where the wear is occurring at an unacceptable rate. For example, the initial voltage distribution 222 moves higher over time as represented by arrow 211 and distributions 223 and 224. As further described herein, the wear rate for the NVM cells is deemed unacceptable because the voltage distributions move too fast, crossing above the low read margin voltage level 207 within the selected time period again represented by arrow 211. Similarly, the initial voltage distribution 227 for programmed cells moves lower over time as represented by arrow 211 and distributions 228 and 229. As further described herein, the wear rate for the NVM cells is deemed unacceptable because the voltage distributions for the programmed cells shift too quickly, crossing below the high read margin voltage level 208 over a selected time period again represented by arrow 211. The relatively rapid wear rate represented by distributions 230 can indicate that the NVM cells are operating outside of acceptable parameters in that they are showing signs of unusually quick wear as represented by the rapid movement of the distributions over time. This unexpected and unacceptable wear represents the potential for read failures or false pass ECC checks that may lead to catastrophic results in sensitive applications.

Figure 3:
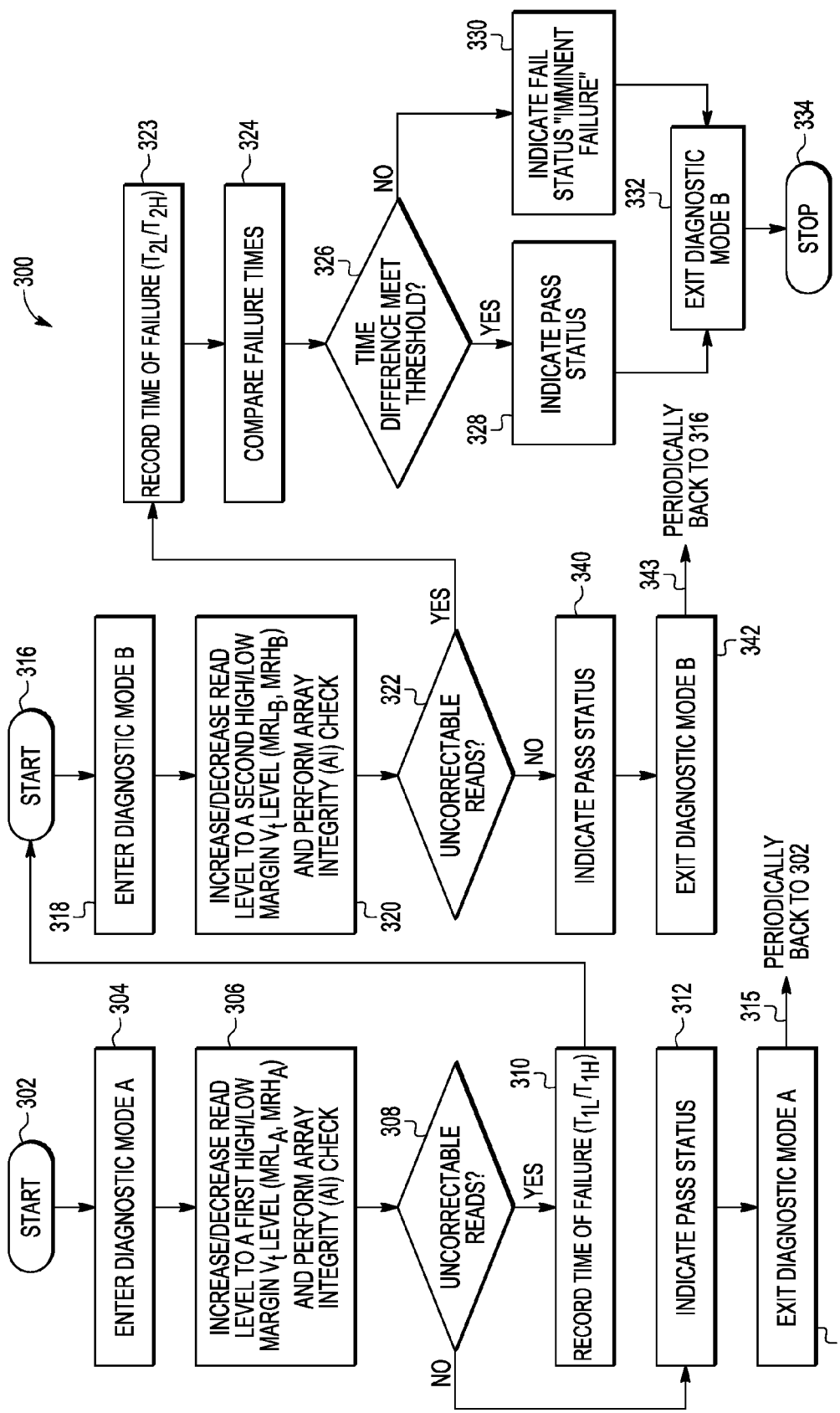
FIG. 3 is a process flow diagram of an example embodiment where diagnostic modes are used to determine unexpected wear for erased and programmed NVM cells.
Figure 4:
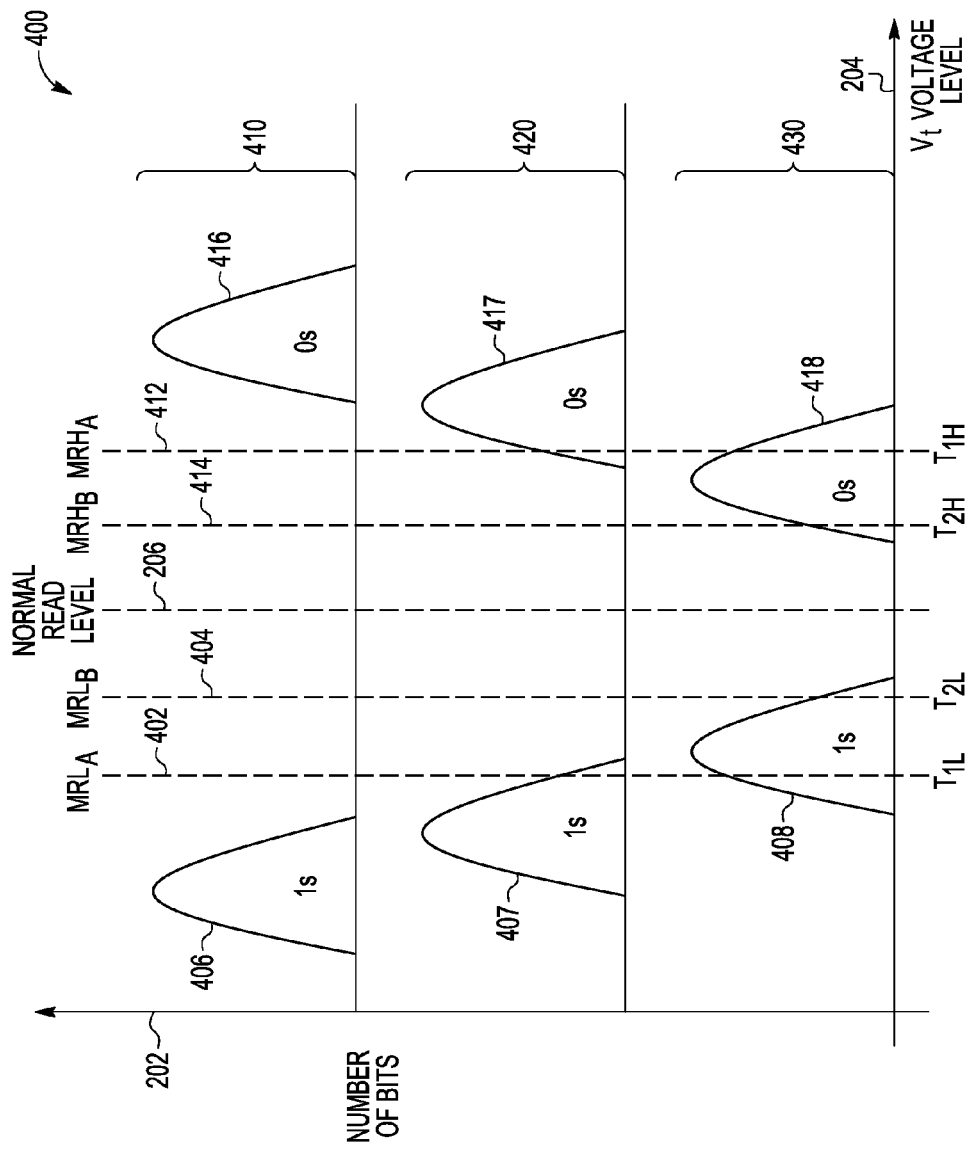
FIG. 4 is a bit distribution histogram associated with the embodiment of FIG. 3.

Advantageously, the embodiments described herein provide for detection of imminent read failures associated with unacceptable wear rates determine by applying different sets of high/low read margin voltages during multiple diagnostic modes to determine wear rates for erased cell distributions and for programmed cell distributions within the NVM cell array 124. FIG. 3 provides an example embodiment where two diagnostic modes are used to identify unacceptable wear rates and to provide an associated failure indication. FIG. 4 provides example voltage distributions associated with the embodiment of FIG. 3.

As described in more detail below, the first diagnostic mode (MODE A) is used to identify a first time of failure ($T_{1L}/T_{1H}$) when erased bits or programmed bits for the NVM cells cross a first threshold level represented by a first set of voltage levels ($MRL_A/MRH_A$) 402/412. The second diagnostic mode (MODE B) is used to identify a second time of failure ($T_{2L}/T_{2H}$) when erased bits or programmed bits for the NVM cells cross a second threshold level represented by a second set of voltage levels ($MRL_B/MRH_B$) 404/414. The time difference ($T_{2L}-T_{1L}$ or $T_{2H}-T_{2L}$) is then compared against the time wear threshold value ($T_{WL}$ or $T_{WH}$) to determine whether or not to indicate an imminent failure. As a difference between a second time of failure and a first time of failure is being used, the system can be configured to run the second diagnostic mode (MODE B) only after the first diagnostic mode (MODE A) has determined a first time of failure ($T_{1L}/T_{1H}$). Variations could also be implemented, as desired.

FIG. 3 is a process flow diagram of an example embodiment 300 where diagnostic modes are used to determine unexpected wear for NVM cells. In particular, embodiment 300 utilizes two diagnostic modes that are used to determine a wear level for erased distributions using low read margin levels ($MRL_A$, $MRL_B$) and to determine a wear level for programmed distributions using high read margin levels ($MRH_A$, $MRH_B$). The first diagnostic mode (MODE A) uses a first low read margin level ($MRL_A$) or a first high read margin level ($MRH_A$). The second diagnostic mode (MODE B) uses a second low read margin level ($MRL_B$) or a second high read margin level ($MRH_B$). As described herein, the first diagnostic mode (MODE A) is run on a periodic basis until it detects an uncorrectable error at which time a first failure time value ($T_{1L}/T_{1H}$) is recorded. The second diagnostic mode (MODE B) is then run on a periodic basis until it detects an uncorrectable error at which time a second failure time value ($T_{2L}/T_{2H}$) is recorded. If the difference between the second failure time value ($T_{2L}/T_{2H}$) and the first failure time value ($T_{1L}/T_{1H}$) does not meet a predetermined threshold value for acceptable wear (e.g., $T_{2L}-T_{1L} \leq T_{WL}$ or $T_{2H}-T_{1H} \leq T_{WH}$), then an imminent failure condition is reported. If the difference does meet the predetermined threshold value for acceptable wear (e.g., $T_{2L}-T_{1L} > T_{WL}$ or $T_{2H}-T_{1H} > T_{WH}$), then a non-failure pass condition is reported. It is again noted that a calibration table stored with a data storage medium, such as data storage medium 112, can be used to store the wear time threshold values and/or other date that are used for this imminent failure determination.

Looking now in more detail to FIG. 3, the imminent failure detection process starts in block 302. In block 304, a first error diagnostic mode (MODE A) is entered. In block 306, the read voltage level is decreased to a first margin read low voltage (Vt) level (MRL$_A$) below the normal read voltage level for the erased distribution wear determination or increased to a first margin read high voltage (Vt) level (MRH$_A$) above the normal read voltage level for the programmed distribution wear determination, and an array integrity (AI) check is then performed where the address sequencer 106 is used by the MMU 102 to cycle through addresses for the cell array 124 and to conduct a read and ECC operation for each address using the adjusted read voltage levels (MRL$_A$/MRH$_A$). In block 308, a determination is made whether the ECC logic 104 detected any uncorrectable errors (e.g., double-bit errors). If "NO," then flow passes to block 312 where a pass status is indicated, for example, using the failure indicator signal 138 and/or flag 114. Flow then passes to block 314 where the first diagnostic mode (MODE A) is exited.

As indicated herein, this first diagnostic mode (MODE A) is periodically run and started at block 302 as indicated by the arrow 315 for each of the wear level determinations (e.g., erased cells and programmed cells) until an uncorrectable error is detected with respect to low voltage level (MRL$_A$) for erased bits or the high voltage level (MRH$_A$) for programmed bits. Once the determination in block 308 is "YES," then flow passes to block 310. In block 310, a first time of failure value (T$_{1L}$/T$_{1H}$) is recorded that represents the time when the first diagnostic mode (MODE A) detects an uncorrectable error for the NVM cells with respect to the erased bits (e.g., T$_{1L}$ is recorded) or with respect to the programmed bits (e.g., T$_{1H}$ is recorded). Flow then passes to block 316. It is noted that the high/low adjusted read voltage levels (MRL$_A$, MRH$_A$) for the first diagnostic mode (MODE A) can be stored in data storage medium 112 as first diagnostic mode parameters 118. It is also noted that the first failure time values (T$_{1L}$, T$_{1H}$) can be stored within the data storage medium 112 as time representations (T$_{1L}$, T$_{1H}$) 115. It is also noted that if only one of the wear level determinations returns an uncorrectable error, the first diagnostic mode (MODE A) will continue to be periodically run for the other wear level determination. As such, the erased bits wear level determination and the programmed bits wear level determination are separately tracked.

Once an uncorrectable error has been detected by the first diagnostic mode (MODE A), the imminent failure detection embodiment 300 then proceeds to block 316 where the second diagnostic mode (MODE B) is started. In block 318, the second error diagnostic mode (MODE B) is entered. In block 320, the read voltage level is decreased to a second read margin low voltage (Vt) level (MRL$_B$) below the normal read voltage level if the first error diagnostic mode (MODE A) resulted in an uncorrectable erased bit error or is increased to a second read margin high voltage (Vt) level (MRH$_B$) above the normal read voltage level if the first error diagnostic mode (MODE A) resulted in an uncorrectable programmed bit error. An array integrity (AI) check is then performed where the address sequencer 106 is used by the MMU 102 to cycle through addresses for the cell array 124 and to conduct a read and ECC operation for each address using the adjusted read voltage levels (MRL$_B$, MRH$_B$). In block 322, a determination is made whether the ECC logic 104 detected any uncorrectable errors (e.g., double-bit errors). If "NO," then flow passes to block 340 where a pass status is indicated, for example, using the failure indicator signal 138 and/or flag 114. Flow then passes to block 342 where the second diagnostic mode (MODE B) is exited.

As indicated herein, this second diagnostic mode (MODE B) is periodically run and started at block 316 as indicated by the arrow 343 until an uncorrectable error is detected. Once the determination in block 322 is "YES," then flow passes to block 323. In block 323, a second time of failure value (T$_{2L}$/T$_{2H}$) is recorded that represents the time when the second diagnostic mode (MODE B) detects an uncorrectable error for the NVM cells with respect to the erased bits (e.g., T$_{2L}$, is recorded) or with respect to the programmed bits (e.g., T$_{2H}$ is recorded). It is noted that the high/low adjusted read voltage levels (MRL$_B$, MRH$_B$) for the second diagnostic mode (MODE B) can be stored in data storage medium 112 as second diagnostic mode parameters 119. It is also noted that the second failure time values (T$_{2L}$, T$_{2H}$) can be stored within the data storage medium 112 as time representation (T2) 116. It is further noted that the second diagnostic mode (MODE B) is also run separately for the erased bits wear level determination and the programmed bits wear level determination.

After both diagnostic modes (MODE A and MODE B) have detected an uncorrectable error for either the erased bits or the programmed bits and flow passes to block 324, the second failure time value (T$_{2L}$/T$_{2H}$) and the first failure time value (T$_{1L}$/T$_{1H}$) are compared. In block 326, this comparison is then used to determine if the difference (e.g., T$_{2L}$−T$_{1L}$ or T$_{2H}$−T$_{1H}$) satisfies a predetermined wear time threshold value (T$_{WL}$ or T$_{WH}$) that represents an acceptable wear rate for the NVM cells. If "YES," then flow passes to block 328 where a pass status is indicated, for example, using the failure indicator signal 138 and/or flag 114. If "NO," then flow passes to block 330 where an imminent failure status is indicated as being detected, for example, using the failure indicator signal 138 and/or flag 114. The second diagnostic mode (MODE B) is then exited in block 332 which is reached from block 328 or block 330, and the process stops in block 334. It is noted that a failure flag 114 can also be stored within data storage medium 112 to represent the fail or pass status for the imminent failure detection. The failure data 140, including the flag 114 and the failure time values (T$_{1L}$ and T$_{2L}$ and/or T$_{H1}$ and T$_{2H}$) 115/116, can be accessed by or output to external circuitry or devices. It is further noted that additional and/or different process blocks could also be used with respect to embodiment 300 if desired.

As indicated above, a calibration table can be used by the NVM system 100 to store the threshold wear time values and/or other data used by the imminent failure determination. The data for this table can be determined and stored, for example, based upon data measured during production test for the NVM system 100. The TABLE below provides an example for a calibration table that can be stored within the NVM system 100, such as within data storage medium 112 and/or another data storage medium coupled to NVM system 100. For this example embodiment, the TABLE stores the threshold wear time values (T$_{WL}$, T$_{WH}$) as well as the low/high read voltage levels used by the diagnostic modes.

TABLE

EXAMPLE CALIBRATION TABLE

| LOW READ LEVEL | HIGH READ LEVEL | TIME THRESHOLDS |
|---|---|---|
| MRL$_A$ | MRH$_A$ | T$_{WL}$ |
| MRL$_B$ | MRH$_B$ | T$_{WH}$ |

It is also noted that the first failure time values ($T_{1L}$, $T_{1H}$), the second failure time values ($T_{1L}$, $T_{1H}$), and the wear time threshold values ($T_{WL}$, $T_{WH}$) are representations of the passage of time and are not required to be direct time measurements. Although timestamps from a reference clock can be used for the failure time values and actual time representations (e.g., years, months, days, minutes, etc.) can be used for the for the wear time threshold values, other non-direct representations of time can also be used such as one or more counted values. For example, one or more counts or incremented values can be used instead of a direct timestamp or time measurement. In one embodiment, a number of power-up events for the NVM system 100 can be tracked and used to represent passage of time such that the time threshold values represent an acceptable threshold number of power-up events between the uncorrectable errors detected by the two diagnostic modes. A number of operational cycles for the NVM system 100 can also be used to represent passage of time such that the time threshold values represent an acceptable threshold number of cycles between the uncorrectable errors detected by the two diagnostic modes. With respect to an automotive solution, for example, a number of automobile starts for an automobile within which the NVM system 100 is installed and operating can be used to represent passage of time such that time threshold values represent an acceptable threshold number of automobile starts between the uncorrectable errors detected by the two diagnostic modes. An odometer reading for an automobile can also be used to represent passage of time such that the time threshold values represent an acceptable mileage threshold between the uncorrectable errors detected by the two diagnostic modes. Other representations of the passage of time could also be used while still taking advantage of the imminent failure detection embodiments described herein.

FIG. 4 is a bit distribution histogram 400 associated with the embodiment of FIG. 3. For embodiment 400, the y-axis 202 represents a number of bits within the cell array having threshold voltage (Vt) levels in an erased state (e.g., representing logic 1s) and in a programmed state (e.g., representing logic 0s). The x-axis 204 represents threshold voltage (Vt) levels for the NVM cells. Voltage level 206 represents a normal read voltage level such that bits having voltage levels above this read level are deemed to be programmed bits (e.g., logic 0s) and bits having voltage levels below this read level are deemed to be erased bits (e.g., logic 1s). Voltage level ($MRL_A$) 402 represents a first selected voltage level for the read margin low voltage level used by the first diagnostic mode (MODE A), and voltage level ($MRL_B$) 404 represents a second selected voltage level for the read margin low voltage level used by the second diagnostic mode (MODE B). Voltage level ($MRH_A$) 412 represents a first selected voltage level for the read margin high voltage level used by the first diagnostic mode (MODE A), and voltage level ($MRH_B$) 414 represents a second selected voltage level for the read margin high voltage level used by the second diagnostic mode (MODE B). It is again noted that the logic 0 or logic 1 designation given to an erased or programmed bit could be switched, if desired, such that an erased bit is a logic 0 and a programmed bit is a logic 1. Other variations could also be implemented.

As described above, the first diagnostic mode (MODE A) is used to identify a first time of failure ($T_{1L}/T_{1H}$) when erased bits or programmed bits for the NVM cells cross a first threshold level represented by a first set of voltage levels ($MRL_A$/$MRH_A$) 402/412. The second diagnostic mode (MODE B) is used to identify a second time of failure ($T_{2L}/T_{2H}$) when erased bits or programmed bits for the NVM cells cross a second threshold level represented by a second set of voltage levels ($MRL_B$/$MRH_B$) 404/414. The time difference ($T_{2L}$-$T_{1L}$ or $T_{2H}$-$T_{2L}$) is then compared against the time wear threshold value ($T_{WL}$ or $T_{WH}$) to determine whether or not to indicate an imminent failure.

Looking more particularly to embodiment 400 provided in FIG. 4, distribution curves 410 represent an initial state for the NVM system 100. In particular, the distribution curve 406 represents the erased state bits for initial operations for the NVM system 100, and the distribution curve 416 represents the programmed state bits for initial operations for the NVM system 100. Distribution curves 420 represent the first time of failure ($T_{1L}$) when the erased distribution curve 407 crosses the first low voltage level ($MRL_A$) 402 or the time of failure ($T_{1H}$) when the programmed distribution curve 417 crosses the first high voltage level ($MRH_A$) 412 causing the first diagnostic mode (MODE A) to detect an uncorrectable bit error. Distribution curves 430 represent the second time of failure ($T_{2L}$) when the erased distribution curve 408 crosses the second low voltage level ($MRL_B$) 404 or the time of failure ($T_{2H}$) when the erased distribution curve 418 crosses the high voltage level ($MRH_B$) 414 causing the second diagnostic mode (MODE B) to detect an uncorrectable bit error. As described above, the difference between these two detected times of failure ($T_{2L}$-$T_{1L}$ or $T_{2H}$-$T_{1H}$) is compared to a threshold wear time value ($T_{WL}$ or $T_{WH}$) to determine if the NVM cell array 124 is experiencing an unacceptable wear rate such that an imminent failure is indicated.

As one example, the first low voltage read level ($MRL_A$) 402 can be between 0.6 to 1.0 volts below the normal read voltage level 206, and the second low voltage read level ($MRL_B$) 404 can be between 0.3 to 0.6 volts below the normal voltage level. In addition, the first high voltage read level ($MRH_A$) 412 can be between 0.6 to 1.5 volts above the normal read voltage level 206, and the second high voltage read level ($MRH_B$) 414 can be between 0.3 to 0.6 volts above the normal voltage level.

As described herein, a variety of embodiments can be implemented and different features and variations can be implemented, as desired.

In one embodiment, a method for detecting imminent read failures for a non-volatile memory (NVM) system is disclosed that includes periodically performing read operations for a first diagnostic mode for an array of non-volatile memory (NVM) cells until a first uncorrectable read error is detected at a first time, periodically performing read operations for a second diagnostic read mode for the array of NVM cells until a second uncorrectable read error is detected at a second time, comparing a difference between the second time and the first time with a threshold time value, and indicating an imminent read failure for the array of NVM cells based upon the comparison.

For other embodiments, the first diagnostic mode can uses a first low voltage read level less than a normal read voltage level and can use a first high voltage read level greater than the normal read voltage level where the normal read voltage level being used for non-diagnostic read operations for the array of NVM cells. Further, the first low voltage read level can be between 0.6 to 1.0 volts below the normal read voltage level, and the first high voltage read level can be between 0.6 to 1.5 volts above the normal read voltage level. In addition, the second diagnostic mode can use a second low voltage read level less than the normal read voltage level and greater than the first low voltage read level and can use a second high voltage read level greater than the normal read voltage level and less than the first high voltage read level. Further, the second low voltage read level can be between 0.3 to 0.6 volts below the normal voltage level, and the second high voltage read level can be between 0.3 to 0.6 volts above the normal voltage level. For still further embodiments, the periodically performing, comparing, and indicating steps can be performed using the low voltage read levels for erased cells within the array of NVM cells and are can be performed using the high voltage read levels for programmed cells within the array of NVM cells.

For additional embodiments, the method can include using one or more error correction code (ECC) routines for the periodically performing steps. Further, the error correction routines can be configured to identify a double-bit error as an uncorrectable read error. For other embodiments, the indicating step can include storing within a data storage medium a flag indicating whether or not an imminent read failure condition has been detected. For further embodiments, the indicating step can include outputting a failure indicator signal.

For further embodiments, the first time and the second time can be determined using timestamps and wherein the threshold time value comprises a threshold time difference amount. For still further embodiments, the first time and the second time can be determined using counted values, and the threshold time value represents a threshold counted difference amount. In addition, the counted value can include at least one the following: power-up events for the NVM system, operational cycles for the NVM system, automobile starts for an automobile within which the NVM system is operating, or odometer readings for an automobile within which the NVM system is operating.

In another embodiment, a non-volatile memory (NVM) system having imminent read failure detection is disclosed that includes an NVM including an array of NVM cells, a memory management unit coupled to the array of NVM cells, a controller within the memory management unit coupled to the NVM and configured to perform read operations for the NVM cells. The controller is configured to periodically perform read operations for a first diagnostic mode for the array of NVM cells until a first uncorrectable read error is detected at a first time. The controller is further configured to periodically perform read operations for a second diagnostic read mode for the array of NVM cells until a second uncorrectable read error is detected at a second time. The controller is also configured to compare a difference between the second time and the first time with a threshold time value and to indicate an imminent read failure for the array of NVM cells based upon the comparison.

For other embodiments, the first diagnostic mode can be configured to use a first low voltage read level less than a normal read voltage level and to use a first high voltage read level greater than the normal read voltage level where the normal read voltage level being used for non-diagnostic read operations for the array of NVM cells. For further embodiments, the second diagnostic mode can be configured to use a second low voltage read level less than the normal read voltage level and greater than the first low voltage read level and to use a second high voltage read level greater than the normal read voltage level and less than the first high voltage read level. For still further embodiments, the controller can be configured to use the low voltage read levels to indicate imminent read failures for erased cells within the array of NVM cells and to use the high voltage read levels to indicate imminent read failures for programmed cells within the array of NVM cells. For other embodiments, the NVM system can further include a data storage medium configured to store the low voltage read levels, the high voltage read levels, and at least one threshold time value.

For additional embodiments, the memory management unit can further include error correction code (ECC) logic configured to run one or more ECC routines, and the controller can be further configured to use results from the ECC logic as indications of uncorrectable read errors. Still further, the controller can be further configured to indicate the imminent read failure using a flag within a data storage medium or using a failure indicator output signal or both.

It is noted that the functional blocks, devices, and/or circuitry described herein, including those described with respect to the memory management unit 102 and the non-volatile memory 120, can be implemented using hardware, software, or a combination of hardware and software. In addition, one or more processing devices executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer readable mediums (e.g., data storage devices, FLASH memory, random access memory, read only memory, programmable memory devices, reprogrammable storage devices, hard drives, floppy disks, DVDs, CD-ROMs, and/or any other tangible storage medium) and that are executed by one or more central processing units (CPUs), controllers, microcontrollers, microprocessors, hardware accelerators, processors, and/or other processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for detecting imminent read failures for a non-volatile memory (NVM) system, comprising:
   periodically performing read operations for a first diagnostic mode for an array of non-volatile memory (NVM) cells until a first uncorrectable read error is detected at a first time;
   periodically performing read operations for a second diagnostic read mode for the array of NVM cells until a second uncorrectable read error is detected at a second time;
   comparing a difference between the second time and the first time with a threshold time value; and
   indicating an imminent read failure for the array of NVM cells based upon the comparison.

2. The method of claim 1, wherein the first diagnostic mode uses a first low voltage read level less than a normal read voltage level and uses a first high voltage read level greater than the normal read voltage level, the normal read voltage level being used for non-diagnostic read operations for the array of NVM cells.

3. The method of claim 2, wherein the first low voltage read level is between 0.6 to 1.0 volts below the normal read voltage level, and wherein the first high voltage read level is between 0.6 to 1.5 volts above the normal read voltage level.

4. The method of claim 2, wherein the second diagnostic mode uses a second low voltage read level less than the normal read voltage level and greater than the first low voltage read level and uses a second high voltage read level greater than the normal read voltage level and less than the first high voltage read level.

5. The method of claim 4, wherein the second low voltage read level is between 0.3 to 0.6 volts below the normal voltage level, and wherein the second high voltage read level is between 0.3 to 0.6 volts above the normal voltage level.

6. The method of claim 4, wherein the periodically performing, comparing, and indicating steps are performed using the low voltage read levels for erased cells within the array of NVM cells and are performed using the high voltage read levels for programmed cells within the array of NVM cells.

7. The method of claim 1, further comprising using one or more error correction code (ECC) routines for the periodically performing steps.

8. The method of claim 7, wherein the error correction routines are configured to identify a double-bit error as an uncorrectable read error.

9. The method of claim 1, wherein the indicating step comprises storing within a data storage medium a flag indicating whether or not an imminent read failure condition has been detected.

10. The method of claim 1, wherein the indicating step comprises outputting a failure indicator signal.

11. The method of claim 1, wherein the first time and the second time are determined using timestamps and wherein the threshold time value comprises a threshold time difference amount.

12. The method of claim 1, wherein the first time and the second time are determined using counted values and wherein the threshold time value represents a threshold counted difference amount.

13. The method of claim 12, wherein the counted value comprises at least one the following: power-up events for the NVM system, operational cycles for the NVM system, automobile starts for an automobile within which the NVM system is operating, or odometer readings for an automobile within which the NVM system is operating.

14. A non-volatile memory (NVM) system having imminent read failure detection, comprising:
 a non-volatile memory (NVM) including an array of NVM cells;
 a memory management unit coupled to the array of NVM cells;
 a controller within the memory management unit coupled to the NVM and configured to perform read operations for the NVM cells;
 the controller being configured to periodically perform read operations for a first diagnostic mode for the array of NVM cells until a first uncorrectable read error is detected at a first time;
 the controller being further configured to periodically perform read operations for a second diagnostic read mode for the array of NVM cells until a second uncorrectable read error is detected at a second time; and
 the controller being further configured to compare a difference between the second time and the first time with a threshold time value and to indicate an imminent read failure for the array of NVM cells based upon the comparison.

15. The NVM system of claim 14, wherein the first diagnostic mode is configured to use a first low voltage read level less than a normal read voltage level and to use a first high voltage read level greater than the normal read voltage level, the normal read voltage level being used for non-diagnostic read operations for the array of NVM cells.

16. The NVM system of claim 15, wherein the second diagnostic mode is configured to use a second low voltage read level less than the normal read voltage level and greater than the first low voltage read level and to use a second high voltage read level greater than the normal read voltage level and less than the first high voltage read level.

17. The NVM system of claim 16, wherein the controller is configured to use the low voltage read levels to indicate imminent read failures for erased cells within the array of NVM cells and to use the high voltage read levels to indicate imminent read failures for programmed cells within the array of NVM cells.

18. The NVM system of claim 16, further comprises a data storage medium configured to store the low voltage read levels, the high voltage read levels, and at least one threshold time value.

19. The NVM system of claim 14, wherein the memory management unit further comprises error correction code (ECC) logic configured to run one or more ECC routines, and wherein the controller is further configured to use results from the ECC logic as indications of uncorrectable read errors.

20. The NVM system of claim 14, wherein the controller is further configured to indicate the imminent read failure using a flag within a data storage medium or using a failure indicator output signal or both.

* * * * *